United States Patent
Birner et al.

(10) Patent No.: US 7,074,317 B2
(45) Date of Patent: Jul. 11, 2006

(54) METHOD FOR FABRICATING TRENCH CAPACITORS FOR LARGE SCALE INTEGRATED SEMICONDUCTOR MEMORIES

(75) Inventors: Albert Birner, Dresden (DE); Dirk Schumann, Dresden (DE); Matthias Goldbach, Dresden (DE)

(73) Assignee: Infineon Technologies AG, Munich (DE)

( * ) Notice: Subject to any disclaimer, the term of this patent is extended or adjusted under 35 U.S.C. 154(b) by 328 days.

(21) Appl. No.: 10/436,427

(22) Filed: May 12, 2003

(65) Prior Publication Data

US 2003/0205483 A1 Nov. 6, 2003

Related U.S. Application Data

(63) Continuation of application No. PCT/EP01/12870, filed on Nov. 7, 2001.

(30) Foreign Application Priority Data

Nov. 10, 2000 (DE) ................................. 100 55 712

(51) Int. Cl.
*H05K 3/07* (2006.01)
(52) U.S. Cl. ..................... 205/676; 205/640
(58) Field of Classification Search ................. 205/640
See application file for complete search history.

(56) References Cited

U.S. PATENT DOCUMENTS

| 4,874,484 | A |   | 10/1989 | Foell et al. |
| 5,139,624 | A | * | 8/1992 | Searson et al. ............. 205/656 |
| 5,209,833 | A |   | 5/1993 | Föll et al. |
| 5,323,035 | A | * | 6/1994 | Leedy ........................ 257/248 |
| 5,348,627 | A | * | 9/1994 | Propst et al. ............... 205/655 |
| 6,004,450 | A | * | 12/1999 | Northrup et al. .......... 205/656 |
| 2001/0055858 | A1 |   | 12/2001 | Birner et al. |

OTHER PUBLICATIONS

Lehmann et al., The Physics of Macropore Formation in Low-Doped p-type Silicon, 1999, Journal of the Electrochemical Society, 146 (8), 1968-2975.*
Propst, E. K. et al.: "The Electrochemical Oxidation of Silicon and Formation of Porous Silicon in Acetonitrile", Journal of the. Electrochemical Society, vol. 141, No. 4, Apr. 1994, pp. 1006-1013.
Ohji, H. et al.: "Fabrication of Mechanical Structures in p-Type Silicon using Electrochemical Etching", Sensors and Actuators, Elsevier, vol. 82, No. 1-3, May 2000, pp. 254-258.
E.A. Ponomarev et al.: "Macropore Formation on p-Type Si in Fluoride Containing Organic Electrolytes", *Electrochemical and Solid-State Letters,* vol. 1, No. 1, 1998, pp. 42-45.

* cited by examiner

*Primary Examiner*—Roy King
*Assistant Examiner*—Michael P. Alexander
(74) *Attorney, Agent, or Firm*—Laurence A. Greenberg; Werner H. Stemer; Ralph E. Locher

(57) ABSTRACT

An electrochemical method is provided for producing trenches for trench capacitors in p-doped silicon with a very high diameter/depth aspect ratio for large scale integrated semiconductor memories. Trenches (macropores) having a diameter of less than about 100 nm and a depth of more than 10 μm can be produced on p-doped silicon having a very low resistivity at a high etching rate.

24 Claims, 7 Drawing Sheets

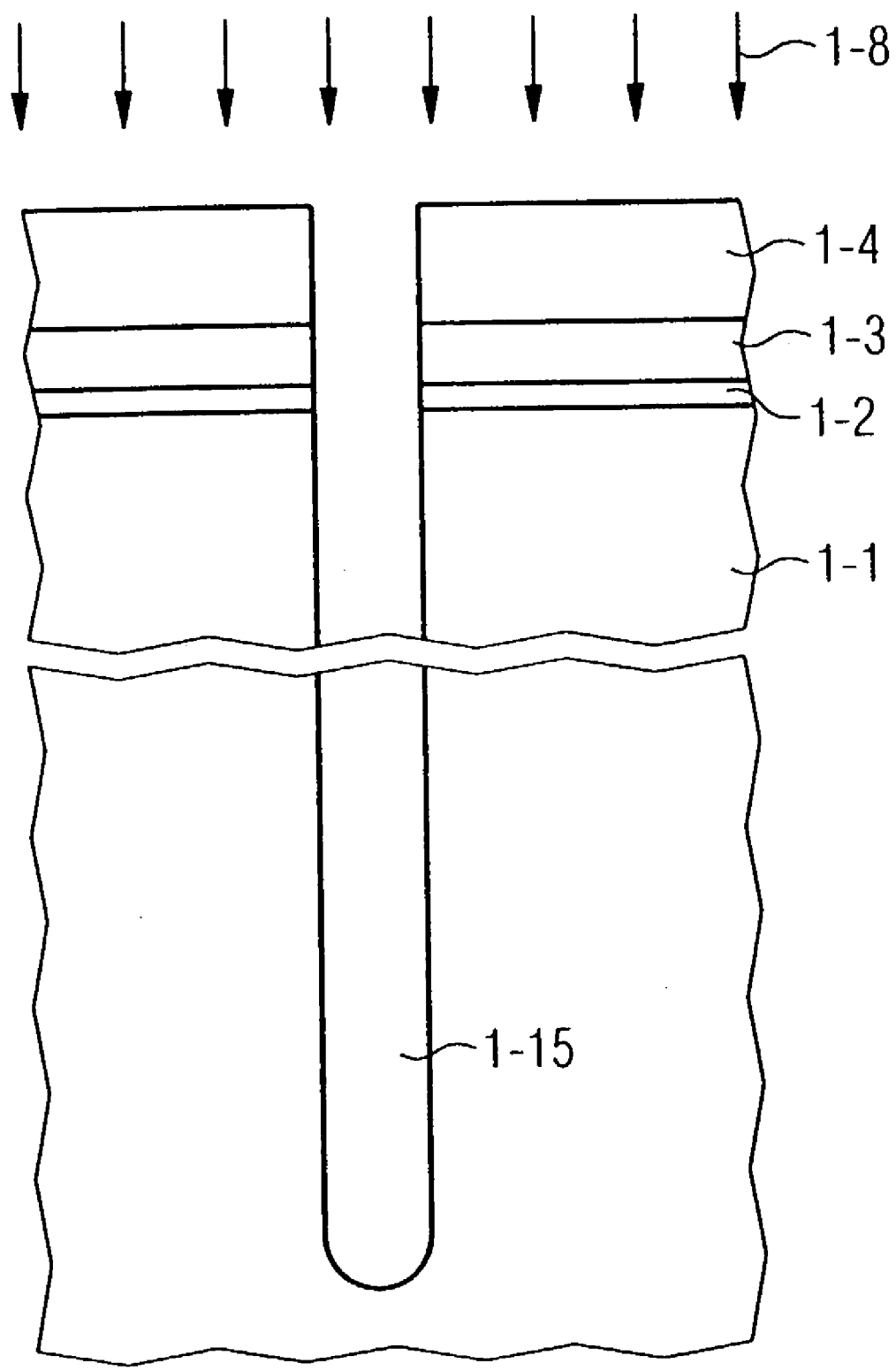

METHOD FOR FABRICATING TRENCH CAPACITORS FOR LARGE SCALE INTEGRATED SEMICONDUCTOR MEMORIES

CROSS-REFERENCE TO RELATED APPLICATION

This application is a continuation of copending International Application No. PCT/EP01/12870, filed Nov. 7, 2001, which designated the United States and was not published in English.

BACKGROUND OF THE INVENTION

Field of the Invention

The invention relates to a method for fabricating trench capacitors in p-doped silicon for large-scale integrated circuits and in particular for DRAM (dynamic random access memory) devices.

In order to read out the charge stored in a storage capacitor of a memory cell in a reproducible manner, the capacitance of the storage capacitor should have at least a value of about 30 fF. At the same time, the lateral extent of the capacitor must be continually reduced in order to increase the storage density. These conflicting requirements of the capacitor of the memory cells lead to an increasingly more complex patterning of the capacitor ("trench capacitors", "stacked capacitors", "crown capacitors") in order to be able to provide an adequate capacitor area despite a decreasing lateral extent of the capacitor.

The fabrication of trench capacitors for DRAM semiconductor memories in accordance with the prior art is described diagrammatically in FIGS. 1A to 1E. In a first step (FIG. 1A), a thin oxide layer (pad oxide) 1-2, a nitride layer 1-3 and an oxide layer 1-4 are applied to a p-doped silicon wafer 1-1. Furthermore, a photoresist mask layer 1-6 is applied to the oxide layer 1-4 and is patterned photolithographically in such a way that the openings of the photoresist mask 1-6 reproduce the position and cross-section of the trenches that will be etched. In this case, the mask openings 1-13 typically have an oval or virtually round cross-section, so that in practice, as seen from above, they are perceived largely as holes. FIG. 1A shows the patterned photoresist mask 106.

In a further step (FIG. 1B), the layer stack including pad oxide 1-2, nitride layer 1-3 and oxide layer 1-4 is patterned in an anisotropic etching step, preferably using a first dry etching gas 1-7. A hard mask has thus been fabricated, at which the trenches can be etched into the p-doped silicon wafer 1-1.

The trenches 1-15 are etched essentially selectively with respect to the oxide mask 1-4 in an anisotropic dry etching step, e.g. by an RIE etching step using a second dry etching gas 1-8, illustrated in FIG. 1C).

In a further step, the inner walls of the trenches 1-15 are n-doped in order that, insulated from the p-doped region surrounding them, they can serve as first electrode 1-10 ("buried plate") for the capacitors to be produced. The n-type doping of the trench inner walls is effected e.g. by the deposition of an arsenic glass silicate layer on the inner walls of the trenches 1-15. A subsequent diffusion step causes the arsenic in the arsenic silicate glass to penetrate into the side wall and produce an n-doped layer which completely surrounds the trenches. The n-doped layers surrounding the trenches constitute the first electrode 1-10 (n-buried plate) for the trench capacitors. The arsenic glass silicate layer is then removed (FIG. 1D).

There then follows: an n-type implantation for short-circuiting adjacent first electrodes 1-10 (not shown in FIG. 1E), the deposition of a capacitor dielectric 1-11, e.g. an oxide-nitride-oxide (ONO) layer, on the first electrode 1-10 and the deposition of an n-doped polysilicon layer, which serves as a second electrode 1-12. By virtue of a subsequent chemical mechanical polishing step (CMP), the capacitor dielectric 1-11 and the polysilicon layer constituting the second electrode 1-12 remain only in the trenches (FIG. 1E). The fabrication of the trench capacitors is thus largely concluded.

In order to provide an adequate electrode area for the minimum capacitance of the storage capacitors in large-scale integrated circuits, at the present time trenches having a depth of about 6–7 µm are routinely produced. The diameter of such trenches is about 300 nm. Consequently, the aspect ratio of the trenches, i.e. the ratio of trench depth to trench diameter, is about 20. However, an even higher integration density requires decreasing trench diameters, which, in order to compensate for the loss of inner wall area, necessitates a larger trench depth and hence an even larger aspect ratio. Here, however, the trench-producing method encounters economic limits since the etching rate in the case of dry etching methods such as the RIE etching method decreases significantly as the aspect ratio rises.

The reason that the etching time rises more than proportionally is that, as the trench depth increases, the feeding-in of the etching gases and the transporting-away of the gaseous etching products proceeds more and more slowly across the trench depth that becomes longer and narrower ("RIE effect"). Even now it takes more than 10 min to produce trenches having a depth of 6–7 µm with a trench diameter of 300 nm. Since the RIE etching process is a single-wafer process, the method for producing even deeper and narrower trenches would become extremely time-consuming and expensive in the very next DRAM generations.

SUMMARY OF THE INVENTION

It is accordingly an object of the invention to provide a method for producing a plurality of trench capacitors, which overcomes the above-mentioned disadvantages of the prior art methods of this general type.

The present invention is based on the object of providing a method for fabricating trench capacitors, which completely or partially eliminates the difficulties presented. In particular, with this method, the intention is to enable the fabrication of trenches having a diameter of 500 nm or less and having an aspect ratio of more than 20 with a high etching rate. The compatibility of the fabrication method with existing methods, in particular, with conventional DRAM fabrication methods, will be largely preserved.

With the foregoing and other objects in view there is provided, in accordance with the invention, a method for producing a plurality of trench capacitors in a p-doped silicon layer for integrated semiconductor memories. The method includes steps of: providing a p-doped silicon layer having a predetermined resistivity, a front side, and a rear side; producing start nuclei on the front side of the p-doped silicon layer; applying an electrolyte to the front side of the p-doped silicon layer; applying an electrical voltage between the rear side of the p-doped silicon layer and the electrolyte such that an electric current having a given current density flows in the p-doped silicon layer and the plurality of trenches are produced; when performing the step of applying the electrical voltage, setting the electrical voltage such that the current density is 1–10 mA/cm$^2$ at the rear side of the p-doped silicon layer and each of the plurality of trenches being produced will have a diameter of less than 300 nm; producing a respective first electrode in each of the plurality of trenches; applying a respective capacitor dielectric to the first electrode in each of the plurality of trenches; and producing a respective second electrode in each of the plurality of trenches.

In accordance with an added feature of the invention, the p-doped silicon layer is a silicon wafer, part of a p-doped silicon wafer, or bears on a p-doped silicon wafer.

In accordance with an additional feature of the invention, the resistivity of the p-doped silicon layer is less than 2 ohm cm.

In accordance with another feature of the invention, the resistivity of the p-doped silicon layer is less than 0.3 ohm cm.

In accordance with a further feature of the invention, the method includes providing a mask for configuring the start nuclei on the front side of the p-doped silicon layer.

In accordance with a further added feature of the invention, the mask is a patterned oxide layer/nitride layer stack, a patterned oxide layer and/or a patterned resist layer.

In accordance with a further additional feature of the invention, the step of producing the start nuclei is performed by overetching while fabricating the mask.

In accordance with another further feature of the invention, the step of producing the start nuclei is performed by alkaline pickling in opened regions of the mask.

In accordance with another added feature of the invention, the method includes: providing the p-doped silicon layer as a silicon wafer having the rear side; and before electrically contact connecting the rear side of the silicon wafer, performing a doping step for producing a p$^+$-type doping layer on the rear side of the silicon wafer.

In accordance with another additional feature of the invention, the method includes removing the p$^+$-type doping layer at the rear side of the silicon wafer after the plurality of trenches are produced.

In accordance with yet an added feature of the invention, the method includes providing the electrolyte as an organic solution having an added amount of hydrofluoric acid or fluorine.

In accordance with yet an additional feature of the invention, the method includes providing the electrolyte as an organic solution with an added amount of acetonitrile (MeCN), dimethylformamide (DMF) or dimethylamide (DMA).

In accordance with yet another feature of the invention, the method includes providing the electrolyte as an aqueous solution having an added amount of hydrofluoric acid.

In accordance with yet a further feature of the invention, the method includes: introducing a counterelectrode in the electrolyte; and performing the step of applying the electrical voltage by applying an electrical voltage between the counterelectrode and the rear side of the p-doped silicon layer.

In accordance with yet a further added feature of the invention, the method includes forming and configuring the counterelectrode with regard to the p-doped silicon layer such that when the electrical voltage is applied between the counterelectrode and the rear side of the p-doped silicon layer, the current density of the electrical current is substantially constant at the rear side of the p-doped silicon layer.

In accordance with yet a further additional feature of the invention, the method includes performing the step of applying the electrical voltage between the counterelectrode and the rear side of the p-doped silicon layer by placing the counterelectrode at a negative potential with respect to the rear side of the p-doped silicon layer.

In accordance with yet another feature of the invention, the method includes predetermining the diameter of each of the plurality of trenches by choosing the resistivity of the silicon layer and the current density.

In accordance with yet another added feature of the invention, the method includes, when performing the step of applying the electrical voltage, varying the current density with respect to time such that the diameter of each of the plurality of trenches being produced varies along a trench depth.

In accordance with yet another additional feature of the invention, the method includes, when performing the step of applying the electrical voltage, varying the current density with respect to time such that each of the plurality of trenches being produced has a bottle shape.

In accordance with an added feature of the invention, the method includes performing the step of applying the electrical voltage such that the diameter of each of the plurality of trenches is less than about 100 nm.

In accordance with an additional feature of the invention, the method includes performing the step of applying the electrical voltage such that a resulting etching rate for producing the plurality of trenches is greater than 1 μm/min.

In accordance with another further feature of the invention, the method includes performing the step of applying the electrical voltage such that each of the plurality of trenches is produced with a depth of more than 5 μm.

In accordance with a further feature of the invention, the method includes performing the step of applying the electrical voltage such that each of the plurality of trenches is produced with a depth of more than about 10 μm.

In accordance with further added feature of the invention, each of the plurality of trenches has a diameter/depth aspect ratio of more than 20.

In accordance with a further additional feature of the invention, each of the plurality of trenches has a diameter/depth aspect ratio of more than 50.

In accordance with a further added feature of the invention, the method includes n-doping trench walls of each of the plurality of trenches by performing a ASG doping and/or a GPD doping.

In accordance with a further additional feature of the invention, the method includes using mesopores to enlarge surfaces of inner walls of the plurality of trenches.

In accordance with yet a further feature of the invention, the semiconductor memories are DRAMs or ferroelectric semiconductor memories.

The invention provides a method for producing trench capacitors in a p-doped silicon layer for integrated semiconductor memories having the following steps:

a p-doped silicon layer having a predetermined resistivity is provided;
  start nuclei are produced on the front side of the p-doped silicon layer;
  an electrolyte is applied to the front side of the p-doped silicon layer;
  an electrical voltage between the rear side of the p-doped silicon layer and the electrolyte is applied, with the result that an electric current having a given current density flows in the silicon layer and trenches are produced;

a first electrode is produced in the trench;
a capacitor dielectric is applied to the first electrode;
a second electrode is produced in the trench.

As mentioned in the introduction, the term trenches means, in particular, trenches in the silicon layer with an essentially round cross-section as seen from the surface of the silicon layer. Trenches having a largely round cross-section with diameters greater than 50 nm are also referred to as macropores in the literature. Macropores in p-doped silicon have only been known for a few years and investigations thereon are described e.g. in E. K. Probst, P. A. Kohl, J. Electrochem. Soc., Vol. 141 (1994), p. 1006, and also V. Lehmann, S. Rönnebeck, J. Electrochem. Soc., Vol. 146 (1999), p. 2968 and E. A. Ponomarev, C. Levy-Clement, Electrochem. and Solid State Lett., Vol. 1 (1998), p. 42. These investigations relate to special macropore embodiments and, in particular, have not been used for applications in microelectronics.

The method uses electrochemical processes between the electrolyte and the p-doped silicon to the effect that, using an electric field applied essentially perpendicularly to the rear side of the silicon layer, silicon is etched away selectively first at the start nuclei and then preferably at the bottom of the trenches that form. The etching selectivity is caused by the field strengths that are increased by the applied voltage and are present first at the start nuclei tips and then at the bottom of the trenches. Since the degree to which the field strength is increased and the extent of the space charge zone also depend on the resistivity of the p-doped silicon layer, the resistivity has an influence on the etching selectivity and hence also on the diameters of the trenches that form.

What is suspected as the physical cause of the selectivity of the etching operation is the Schottky-diode-like junction formed by the junction between the electrolyte and the p-doped silicon. When the electrolytes are at negative potential, the junction between the electrolyte and the p-doped silicon is a forward-biased Schottky junction which, in the silicon transition region, has a small depletion zone width in the case of high fields and a large depletion zone width in the case of small electric fields. Since the charge transport between the undepleted p-silicon layer and the electrolyte depends greatly on the depletion zone width, the etching rate is also determined by the electric field distribution. In this way, it is possible to explain the preferred direction for the etching process and the observation that, above a diameter limit value, etching no longer takes place at the trench walls.

The start nuclei are depressions that are etched into the silicon layer surface in as pointed a manner as possible on the front side of the p-doped silicon layer, and they preferably have the form of inverted pyramids. The fact that the start nuclei have a profile running in as pointed a manner as possible into the silicon layer causes the largest possible electric field peaks and hence effective production of trenches. In this case, for trench formation it suffices for the start nuclei to extend only a few 10 nm from the surface into the p-doped silicon layer, so that it is possible to produce start nuclei by simple local etching.

If the trench formation has begun by using the electrolyte and an applied voltage, the etching preferably takes place at the bottom of the trench, since the highest field is present there. While the trenches are thus etched more and more deeply, the diameter of the trenches increases only up to a limit value, which essentially depends on the p-type doping of the silicon layer, the nature of the electrolyte, and the current density with which the trenches are produced. As a result, trenches having an essentially round cross-section and a largely uniform diameter can be produced from the front side of the silicon layer towards the rear side. In this case, for a given etching rate, the depth of the trenches depends only on the duration of the applied voltage and hence the duration of the current flow, so that with this method it is possible to produce trenches having small diameters and very large depths, which corresponds to very high (depth/diameter) aspect ratios.

After the fabrication of the trenches, a first electrode is produced in the trench, a capacitor dielectric is then applied to the first electrode and a second electrode is then produced in the trench, so that a trench capacitor has been produced. Trenches having a very high aspect ratio afford a large area for the production of trench capacitors of sufficient capacitance in conjunction with a minimal area occupancy on the surface. The minimal area occupancy is a prerequisite for the very large scale integration demanded for semiconductor memories.

Preferably, the p-doped silicon layer is a silicon wafer or part of a p-doped silicon wafer or bears on a p-doped silicon wafer. This ensures the silicon layer has the same doping type as the silicon at the rear contact connection, with the result that pn junctions which restrict a current flow between the front side and the rear side do not occur. Since a very high p-type doping ($>10^{17}$ $1/cm^3$) is required for trenches having very small diameters, the highly doped silicon layer, with a thickness which is preferably greater than the trench depth, is advantageously grown epitaxially on a moderately p-doped silicon wafer.

Preferably, the p-doped silicon layer has a resistivity of less than 2 ohm cm and preferably less than 0.3 ohm cm. Typical values are 1, 0.3 or 0.1 ohm cm. In addition to the current density and the electrolyte type, the resistivity is the determining parameter for the diameter of the trenches. Providing 1 ohm cm p-doped silicon produces trenches having diameters of about 300 nm, 0.3 ohm cm p-doped silicon produces trenches having diameters of about 200 nm, and 0.1 ohm cm p-doped silicon produces trenches having diameters of about 100 nm, in which case the diameters can be varied considerably by way of the applied current density during the electrochemical process. In general, the trench diameter increases approximately with the root of the resistivity of the p-doped silicon layer and, in the region of interest, with the root of the current density.

Preferably, the start nuclei are arranged using a mask on the front side of the p-doped silicon layer. Since the position of the trenches is defined by the position of the start nuclei, the mask indirectly defines the position of the trenches as well. In this case, the start nuclei are preferably produced by an etching step that incipiently etches the silicon layer at the opened regions of the mask. Since the start nuclei only have to have a depth of a few 10 nm, the mask may also preferably have a thickness of less than 100 nm and preferably is only a photoresist, which simplifies the process sequence in terms of production technology. Furthermore, the thin mask facilitates the production of very fine structures, so that trenches can thus be produced with a very high resolution mask.

In another advantageous embodiment, the mask is a patterned oxide layer/nitride layer stack or a patterned oxide layer, since these masks can preferably serve later as patterning masks for subsequent chemical mechanical polishing (CMP) steps. In this case, the oxide layer in the mask preferably has only a stress-relieving function (pad oxide) and can be very thin (<10 nm). A mask made of a thick oxide layer can also serve later as a patterning mask for later CMP steps.

In a preferred embodiment, the start nuclei are produced in the silicon layer by overetching during the fabrication of the mask, e.g. by RIE etching. This saves at least one process step. In another preferred embodiment, the start nuclei are produced by alkaline pickling in the silicon (ammonia etching). During this process, the anisotropic etching behaviour of alkaline pickling in silicon is used to produce start nuclei having the preferred form of inverted pyramids in the surface of the silicon layer.

Preferably, the electrical contact connection of the rear side of the silicon wafer is preceded by a doping step for producing a $p^+$-type doping layer. This doping step is preferably effected by ion implantation. The doping step serves for obtaining an electrical potential that, as much as possible, has the same magnitude as the electrical voltage that is applied on the rear side during the electrochemical process, so that the field lines run largely perpendicularly through the rear side of the silicon layer. If the silicon wafer is made of very low-resistance material on the rear side, i.e. less than e.g. 1 ohm cm, then this step can preferably be omitted. In another advantageous embodiment, the rear side can also be coated with a metal layer, care having to be taken to ensure a good ohmic contact between the metal and the silicon wafer.

Preferably, the $p^+$-type doping layer at the rear side of the silicon wafer is removed, e.g. by being etched away, after the production of the trenches, in order to prevent contamination of the front side of the silicon layer by the doping material in the subsequent process steps.

In another advantageous embodiment, the rear side of the silicon wafer is electrically connected by a conductive liquid which is in contact with the rear side of the silicon wafer. The conductive liquid is preferably a second electrolyte, particularly preferably HF in an aqueous solution. The electrical contact connection of the rear side of the silicon wafer by a conductive liquid has the advantage that a homogeneous low-resistance contact connection distributed over the rear side can be fabricated without a preceding p-type implantation step. Omitting the p-type implantation step obviates the application of a protective layer for protection against contamination during implantation and the etching step for the later removal of the $p^+$-type doping layer on the rear side. A preferred construction of an electrochemical chamber in which the rear side of the silicon wafer is electrically contact-connected by a conductive liquid is described in European Patent No. 0 400 387 entitled "Method for the large-area electrical contact connection of a semiconductor body using electrolytes".

The electrolyte on the front side of the p-doped silicon layer preferably serves both as a charge carrier for the current between the silicon layer and the electrolyte and as a carrier of the chemical substances which, together with the charges from the silicon layer, remove and take away the silicon. Preferably, the electrolyte is an organic solution to which hydrofluoric acid or fluorine has been added, in particular acetonitrile (MeCN), dimethylformamide (DMF) or dimethylamide (DMA), or an aqueous solution to which hydrofluoric acid has been added. Trenches having diameters of less than 1 μm can preferably be produced using the organic electrolytes. The preferred concentration of the hydrofluoric acid in the solutions is about 1 to 20% by weight. The electrolyte covers the front side of the silicon layer preferably in the region in which the trenches are produced.

The electric current for producing the trenches is produced by an electrical voltage which is preferably applied between the rear side of the p-doped silicon layer and a counterelectrode introduced in the electrolyte. In this case, the electrical connection of the p-doped silicon layer to the voltage source is preferably ensured by the contact connection of the rear side of the silicon wafer.

Preferably, the counterelectrode is formed and arranged with regard to the p-doped silicon layer in such a way that when the voltage is applied, the current has a largely constant current density on the rear side of the p-doped silicon layer. This is preferably achieved by using a counterelectrode whose surface facing the silicon wafer is coplanar with respect to the silicon wafer. In this case, the counterelectrode preferably covers at least the region of the silicon layer in which the trenches will be produced. This results in a largely uniform current density on the rear side of the silicon layer in the region of the trenches that will be etched and the preferred current flow runs largely perpendicularly to the rear side of the silicon wafer. A preferred embodiment of an electrochemical chamber in which the inventive electrochemical process can be carried out is described in Published German Patent Application Del. 100 27 931, which has been published in English as U.S. patent application No. 2001 055 858.

Preferably, the counterelectrode is put at a negative electrical voltage with regard to the electrical voltage on the rear side of the p-doped silicon layer. In this way, the Schottky-diode-like interface between the electrolyte and the p-doped silicon layer is forward-biased, thereby giving rise to the selectivity of the etching rate with regard to the trench bottoms and trench walls, which determines the geometry of the trenches that are formed.

Preferably, the resistivity of the silicon layer and the current density are chosen such that a predetermined diameter of the trenches is produced. The term diameter of trenches is generally used to mean the maximum diameter that is established after a sufficiently long trench forming time T0 has elapsed, and which is no longer significantly time-dependent. In this case, the trench forming time T0 is essentially the time required for the trench to develop from the size of the start nucleus to the size at which the self-passivation becomes active at the trench walls. In this case, the self-passivation of the trench walls is essentially given by the selectivity, mentioned in the introduction, with regard to the etching rate at the trenches, which depends on the form of the electric fields and hence on the resistivity of the silicon layer and the current density in the trench region. In this case it emerges that the (maximum) diameter of the trenches decreases approximately with the root of the resistivity of the silicon layer and increases in the certain region with the root of the current density. In this way, the diameter of the trenches can be chosen freely within a wide scope by using a suitable resistivity of the silicon layer and current density. Thus, 1 ohm cm p-doped silicon yields trenches having a diameter of about 500 nm, while 0.1 ohm cm p-doped silicon yields trenches having a diameter of about 100 nm.

In a further preferred embodiment, the current density is varied with respect to time during the production of the trenches, with the result that the trench diameter varies in the direction of the trench depth. The variation of the trench diameters in the direction of the trench depth increases the trench wall surface area for a predetermined trench depth and thereby affords the possibility of further increasing the capacitance of the trench capacitors.

In a further preferred embodiment, the current density is varied with respect to time during trench production in such a way that the trench assumes a bottle-like form. This is achieved e.g. by keeping the current density small in a first phase, so that the trench grows into the depth with a small diameter (neck of bottle), and keeping the current density large in a second phase, so that the trench grows further into the depth with a large diameter (body of bottle). The bottle-like form affords the advantage of a large trench wall surface in conjunction with minimal area occupancy on the surface of the silicon layer. This is advantageous because, for producing storage capacitors on large scale integrated semiconductor memories, not only the trench capacitors, but also transistors and other circuit elements have to be applied on the surface of the silicon layer, so that the area requirement on the surface of the silicon layer is particularly critical.

Instead of by the setting of the current density, the bottle-like form can also be produced by using a suitable doping profile in the trench region of the silicon wafer. Accordingly, the layers having a high doping produce trenches having a small diameter (neck of bottle); and the layers having a low doping produce larger diameters.

Preferably, the electrical voltage is set in such a way that a current density of 1–10 mA/cm$^2$ is produced on the rear side of the p-doped silicon layer. In this region, the trench formation is effected in the manner described. Preferably, the current on the rear side of the silicon layer, in the region of the trenches to be produced, spatially has a largely constant current density. This ensures that the trench formation in the silicon layer proceeds approximately identically for all of the trenches.

The parameters for producing the trenches are preferably set in such a way that the diameter of the trenches is less than 300 nm and preferably less than about 100 nm. For such small trench diameters, in order to be able to obtain the same minimum storage capacitance of about 30 fF, the trenches must be sunk correspondingly deeper. Therefore, the trenches are preferably made deeper than 5 µm and preferably more than about 10 µm. This requires an aspect ratio of about 20, 50 or more, which is very complicated with conventional etching technology, e.g. RIE etching, because of the ever decreasing etching rate for mass production. By contrast, the etching rate of the inventive method is, in principle, largely independent of the aspect ratio. The method therefore preferably produces aspect ratios of more than 20 and preferably more than 50. Moreover, the etching rate of the method is originally preferably approximately a factor of 2 to 10 higher than in conventional etching technologies. The etching rates of the method are preferably greater than 1 µm/min and can be as high as 5 µm/min, so that even deep trenches can be produced in a few minutes.

Preferably, the doping of the trench walls which follows the trench etching is effected by arsenic silicate glass (ASG) doping and/or gas phase doping (GPD), which is introduced into the trenches. A subsequent heat treatment step causes the n-type doping material to penetrate into the trench wall and to be activated. The n-type doping is preferably carried out for the production of the first electrode of a trench capacitor, which is preferably intended to run in a manner insulated from the p-doped silicon layer on the trench wall.

Preferably, the surface of the inner walls of the trenches is enlarged by roughening or by mesopores, in order to further increase the capacitance of the capacitors. The roughening can be produced in particular by the action of hydrofluoric acids or other acids on the inner wall. Mesopores, by contrast, are small worm-hole-like channels, having diameters of significantly less than 50 nm, which can be produced electrochemically at the inner walls of the trenches. This method is preferably carried out in n-doped material, so that the trench inner walls have to be n-doped beforehand. The method for producing mesopores is appropriate for the present inventive method since the preparations for the electrochemical etching process, in particular the contact connection of the rear side of the silicon wafer in an electrochemical chamber, can be adopted for the production of mesopores. Details on the integration of mesopores into the DRAM trench process are disclosed in the German application No. 100 55 711.2 entitled "Self-limiting of mesopore growth in geometrically predefined structures", by M. Goldbach, A. Birner and M. Franosch.

The semiconductor memories to which the inventive method is applied are preferably dynamic random access memory chips (DRAM), ferroelectric semiconductor memories, and all large scale integrated semiconductor memories that store information in the form of the charge state of the storage capacitors. For these devices, the method enables an extremely high packing density of storage capacitors in conjunction with a large cost saving potential by virtue of the simplified method for producing the trench capacitors.

Other features which are considered as characteristic for the invention are set forth in the appended claims.

Although the invention is illustrated and described herein as embodied in a method for fabricating trench capacitors for large scale integrated semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A–1E show a prior art method of fabricating trenches in a p-doped silicon layer in order to produce storage capacitors for a DRAM semiconductor memory;

DESCRIPTION OF THE PREFERRED EMBODIMENTS

Figure 1A:
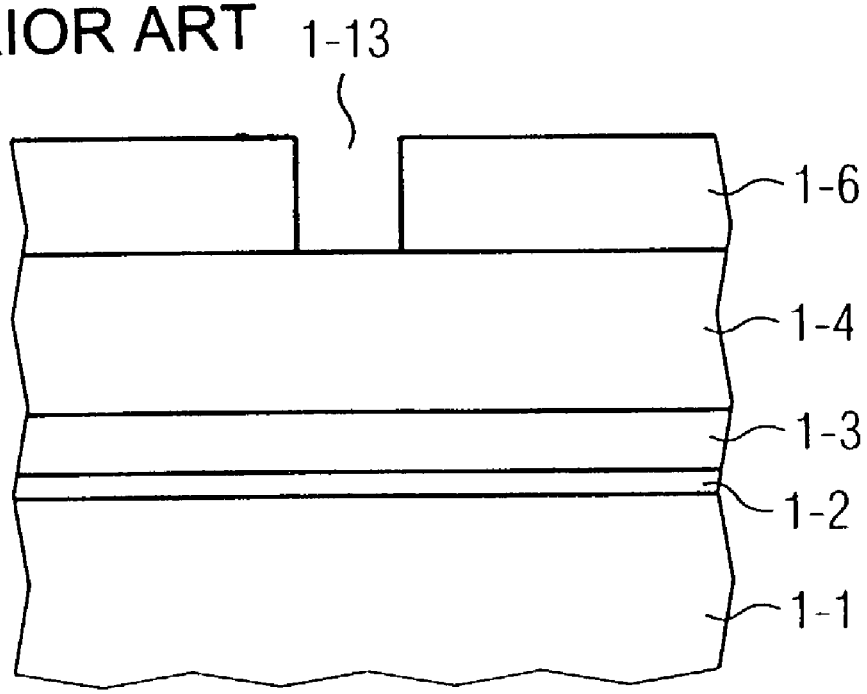
Figure 1B:
Figure 1B:
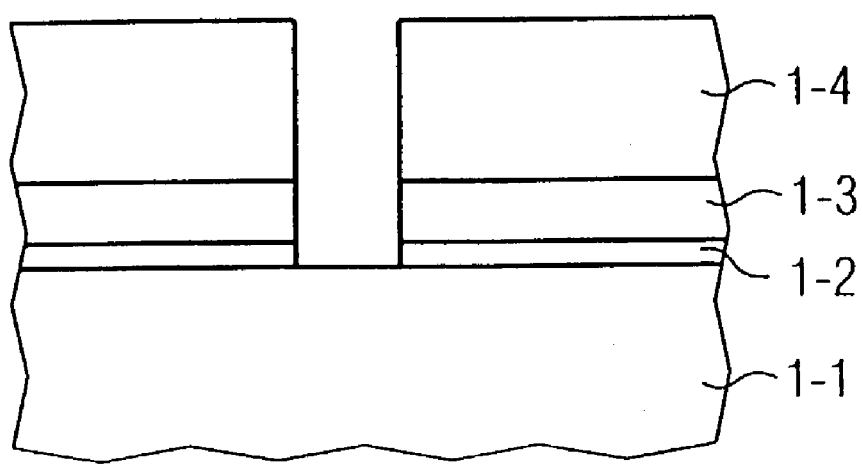
Figure 1E:
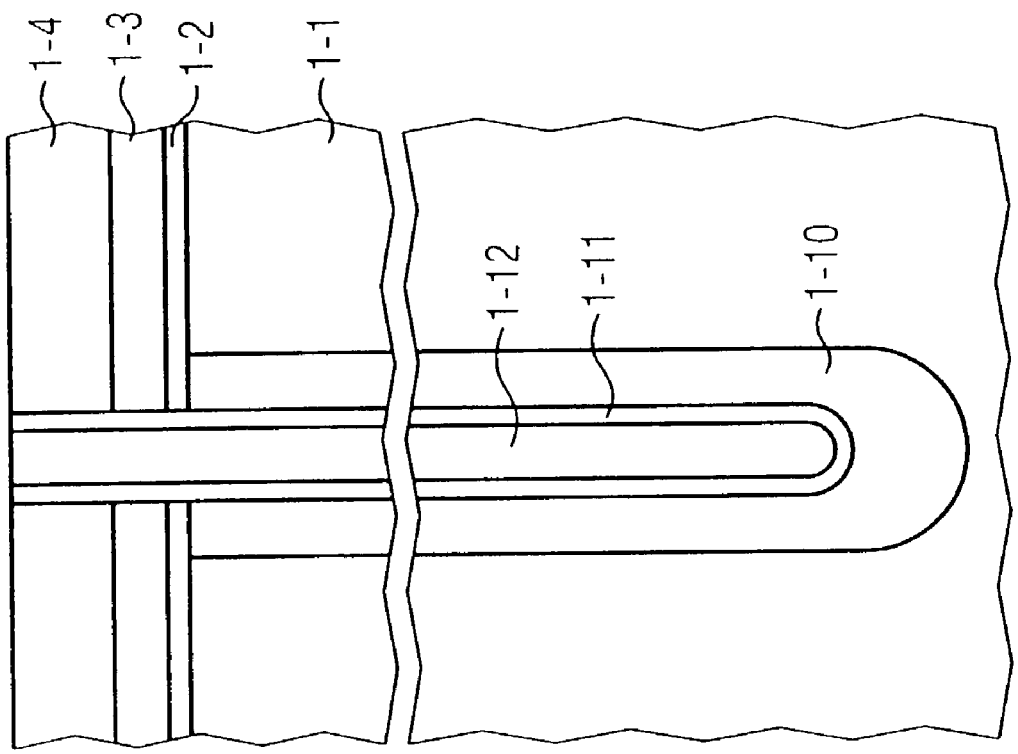
Figure 1D:
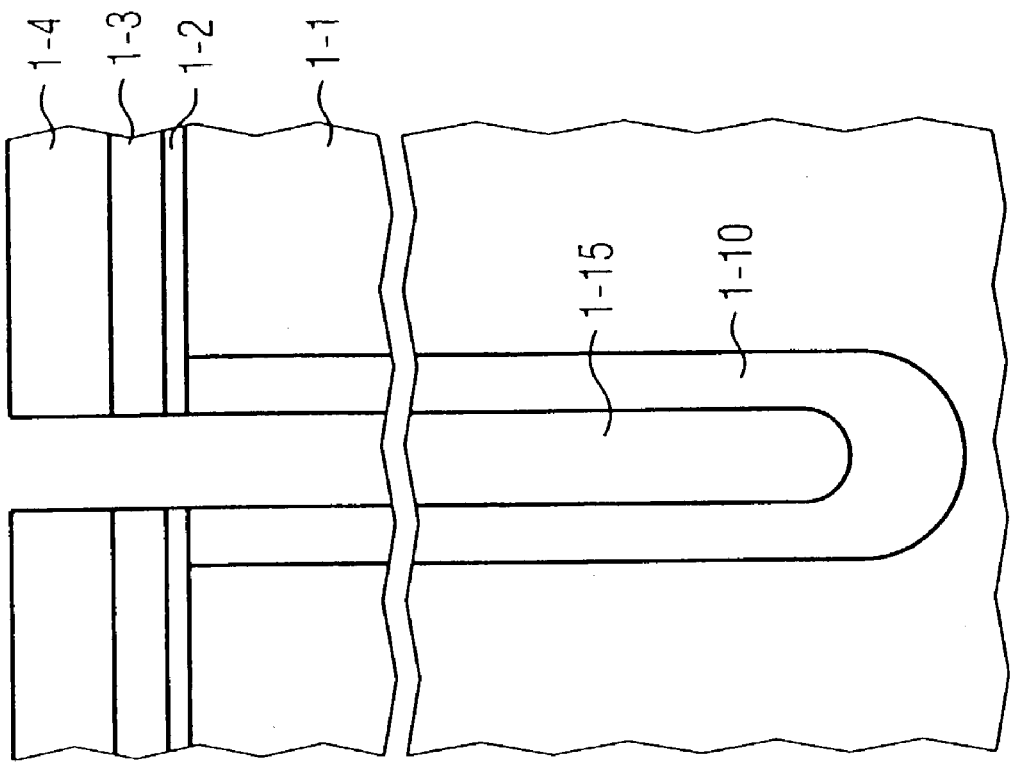

Referring now to the figures of the drawing in detail and first, particularly, to FIGS. 2A–2D thereof, there is shown an inventive method for producing trenches in p-doped silicon, which is part of the sequence of process steps for fabricating DRAM semiconductor memories.

Figure 2B:
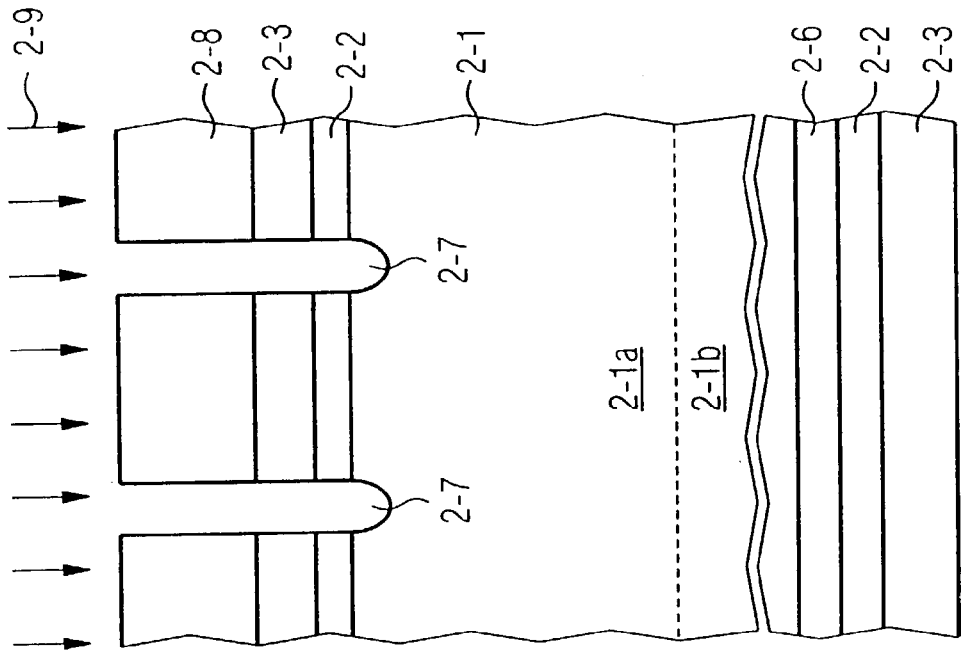
FIGS. 2A–2F show an inventive method of fabricating trenches in a p-doped silicon layer in order to produce storage capacitors for a DRAM semiconductor memory.
Figure 2A:
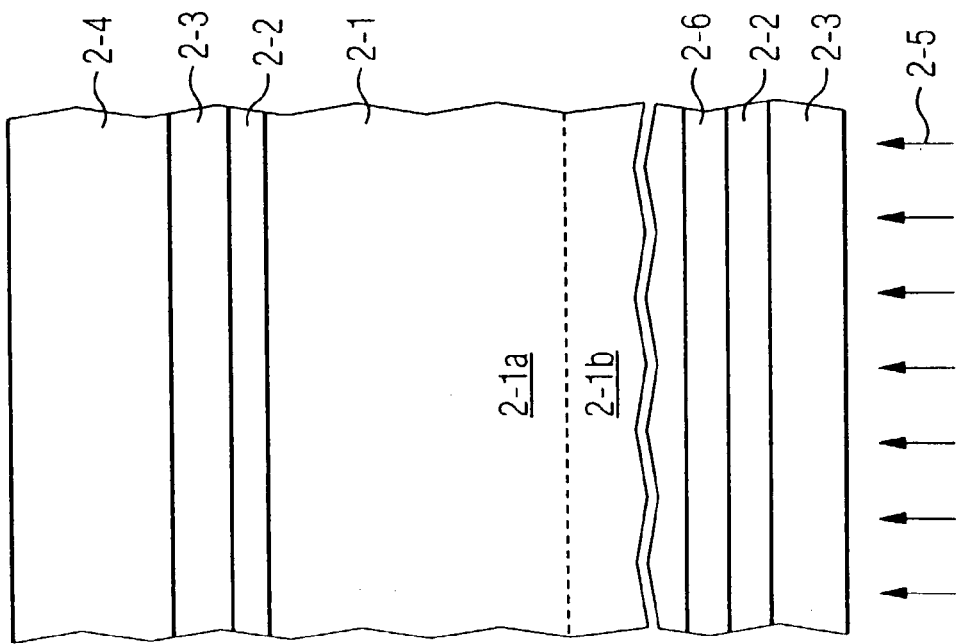
Figure 2C:
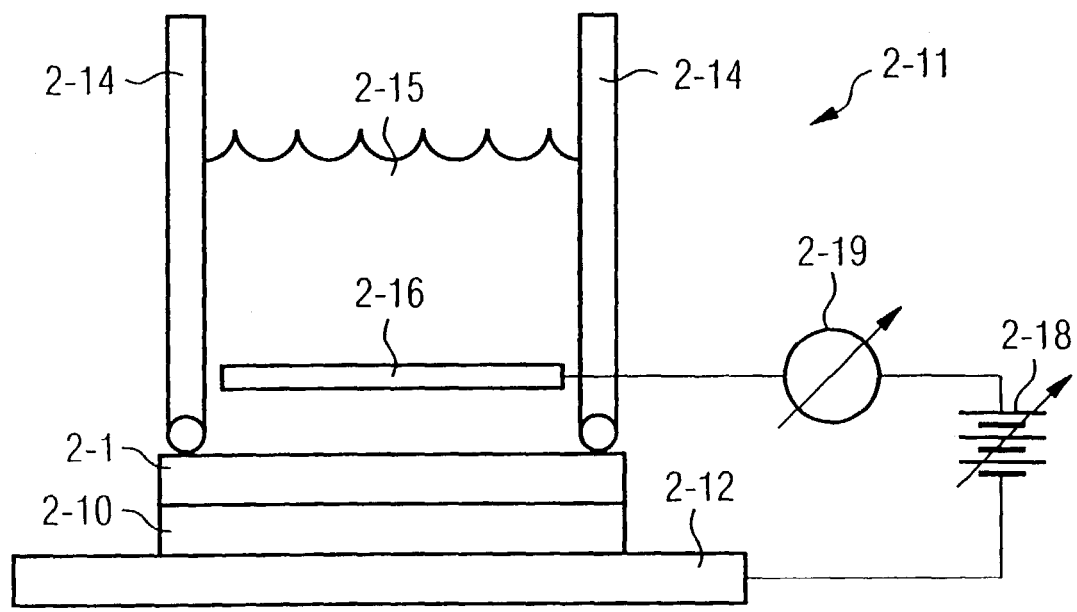

FIG. 2A shows a p-doped silicon wafer 2-1, which includes a highly implanted silicon layer 2-1a having a preferred doping of about $3 \times 10^{17}$ 1/cm$^3$ preferably using boron as a dopant (corresponding to 0.1 ohm cm) and a silicon substrate 2-1b having an average doping of about $10^{16}$ 1/cm$^3$. The preferred crystal orientation of the silicon layer is <100>. The silicon layer 2-1a is preferably applied epitaxially to the silicon substrate 2-1b and preferably has a thickness that is greater than the depth of the trenches that will be etched, that is to say preferably more than 10 µm. The silicon wafer 2-1 has first applied to it, an oxide layer 2-2, which is preferably a thin pad oxide and a nitride layer 2-3, which serves as mask material for the mask that later predetermines the position of the start nuclei. At the same time, this mask also serves as a patterning mask for subsequent CMP patterning processes (damascene patterning methods). Furthermore, as protection for the front side that will be patterned during the subsequent rear-side implantation, a BSG layer 2-4, for example, is applied to the front side.

As an alternative, the oxide-nitride mask layer can also be replaced by a photoresist since, for the purpose of producing the trenches, the mask serves only for fabricating start nuclei which only have to have a depth of a few 10 nm. This is a major simplification of the method. In addition, this procedure results in a better mask resolution since the photoresist mask thereby has to have a thickness of less than 100 nm. What is disadvantageous is that, when using a photoresist mask for producing the start nuclei, a hard mask for CMP steps is not available for later processes. If appropriate, such a hard mask then has to be applied at a later time.

After the (two-sided) application of the oxide nitride layer (2-2 and 2-3), a rear-side implantation through the nitride layer 2-3 and through the oxide layer 2-2 with a p-implant 2-5 is performed, which provides for a low-resistance and uniform p-type implantation layer 2-6 for the rear-side contact connection. A typical implantation dose for the rear-side implantation using boron is $10^{16}$ $1/cm^2$ at an energy of about 220 keV. This method step is shown in FIG. 2A. After the implantation, the BSG layer 2-4 is removed.

FIG. 2B shows the p-doped silicon wafer 2-1 after the production of the mask and the start nuclei 2-7. The mask including the oxide layer 2-2 and the nitride layer 2-3 is advantageously produced by an anisotropic dry etching step using a third dry etching gas 2-9, preferably in an RIE etching step, with an overlying photoresist mask 2-8 fabricated photolithographically. These mask openings have a typical diameter of 70 nm. In an advantageous embodiment, the start nuclei 2-7 are produced by overetching into the silicon layer 2-1a during the production of the mask. This procedure obviates at least one process step.

As an alternative, the start nuclei 2-7 are produced after the etching process in an operation which is separate from the oxide-nitride mask fabrication. In this case, the start nuclei 2-7 are preferably fabricated by etching with alkaline pickling agents. The advantage of, this procedure resides in the inverted pyramid form of the start nuclei produced by the alkaline pickling agent in the silicon. The pickling agent effects anisotropic etching in the silicon. The inverted pyramid form is particularly suitable as a start nucleus by virtue of its vertex directed towards the rear side of the silicon wafer. A pronounced vertex causes a significant electric field elevation, so that the growth of the trenches (macropores) starts there in a defined manner.

After the rear side of the silicon wafer 2-1 has been freed of the nitride layer 2-3 and the oxide layer 2-2 in an etching step, the silicon wafer 2-1 is preferably placed, in an electrochemical chamber 2-11, by placing the rear side of the silicon wafer 2-1 onto a conductive contact layer 2-10 and, if appropriate, by pressing the rear side onto the conductive contact layer 2-10. An embodiment of the electrochemical chamber is illustrated diagrammatically in FIG. 2C. The conductive contact layer 2-10 serves for producing an electrically conductive connection between the substrate holder 2-12 and the silicon wafer 2-1 so that the rear side of the silicon wafer 2-1 can be put at a defined potential.

Furthermore, an etching cup 2-14 is placed on the silicon wafer 2-1 and an O-ring seals the silicon wafer 2-1 and the etching cup 2-14 in a water-tight manner. The electrolyte 2-15 is filled into the etching cup 2-14 and, consequently, only covers the front side of the silicon wafer 2-1. The electrode 2-16 is immersed in the electrolyte 2-15. The surface of the electrode that is directed towards the silicon wafer 2-1 is largely coplanar with respect to the silicon wafer 2-1 and largely covers the silicon wafer 2-1. This ensures a homogeneous current density in the region of the rear side of the silicon wafer 2-1. The current direction runs largely perpendicularly to the rear side of the silicon wafer 2-1. The voltage required for the current flow is provided by a voltage source 2-18 connected between the electrode 2-16 and the substrate holder 2-12. The voltage on the electrode 2-16 is preferably a negative voltage with regard to the substrate holder 2-12. The voltage is advanced until a current density in the range from 1 to 10 $MA/cm^2$ is established. The current and hence the average current density are measured using a current measuring device 2-19.

Figure 2D:
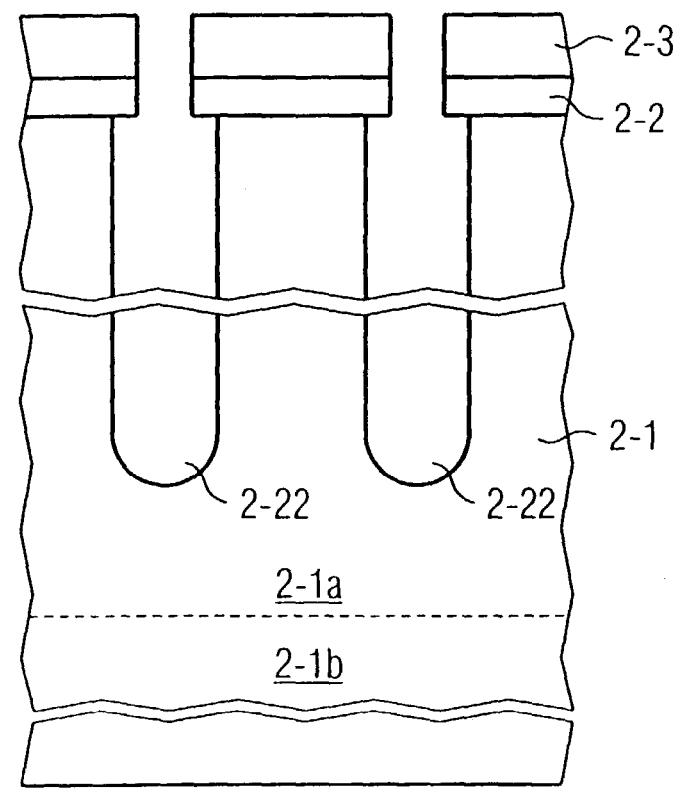

The electrochemical process is preferably conducted with a current density of about 1–10 $mA/cm^2$ and thus produces trenches having a diameter of about 100 nm in the silicon layer. The electrolyte used is preferably an organic electrolyte, preferably acetonitrile (MeCN), dimethylformamide (DMF) or dimethylamide (DMA) with a 4% strength portion of hydrofluoric acid. With these electrolytes, the etching rate is approximately 2 to 5 µm/min, with the result that the electrochemical etching operation for producing trenches having a depth of 10 µm is concluded after 2 to 5 minutes (FIG. 2D). After the electrochemical etching of the trenches, in order to prevent contamination of the front side of the silicon wafer 2-1 by the possibly highly doped rear side, the p-type implantation layer 2-6 is preferably removed from the rear side by etching. The construction illustrated in FIG. 2D is thus obtained.

Afterwards, the oxide-nitride mask (2-2 and 2-3) is preferably etched back using a photolithographic mask, in order to uncover the partially covered trench openings of the trenches 2-22 and to begin the completion of the capacitors. After the oxide-nitride mask (2-2 and 2-3) has been etched back, in a preferred embodiment, an arsenic silicate glass (ASG) layer is introduced into the trenches 2-22. The arsenic is driven into the side walls of the trenches in a heat treatment step, so that the trench walls produce an n-doped region representing the buried capacitor plate 2-24 of the storage capacitor being produced. Instead of the ASG step, the n-type layer can alternatively be effected e.g. by gas phase doping (GPD). The construction resulting from these steps is illustrated in FIG. 2E.

Figure 2F:
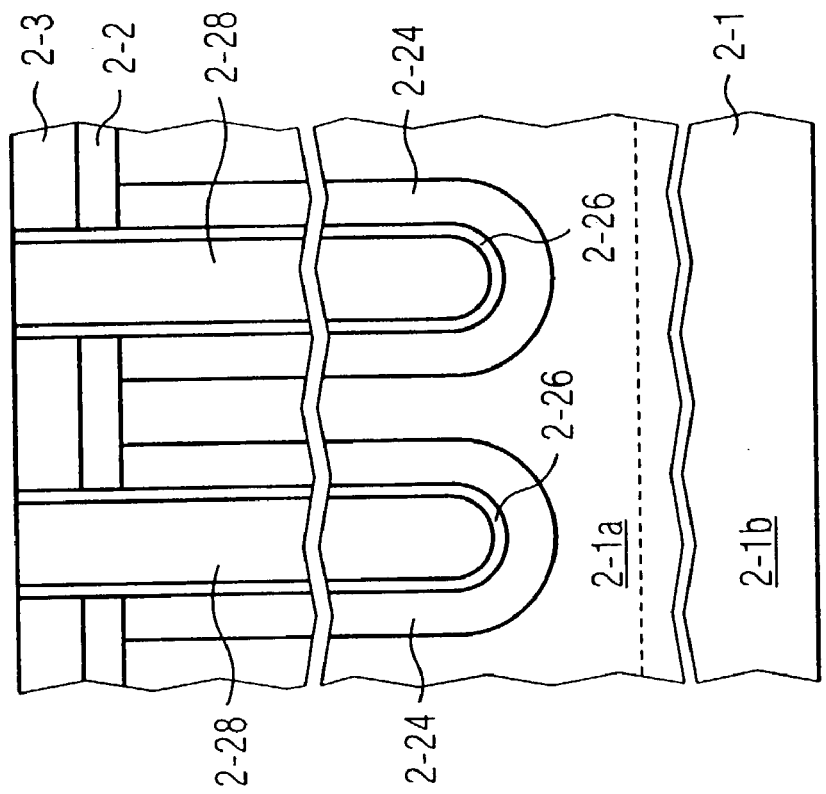
Figure 2E:
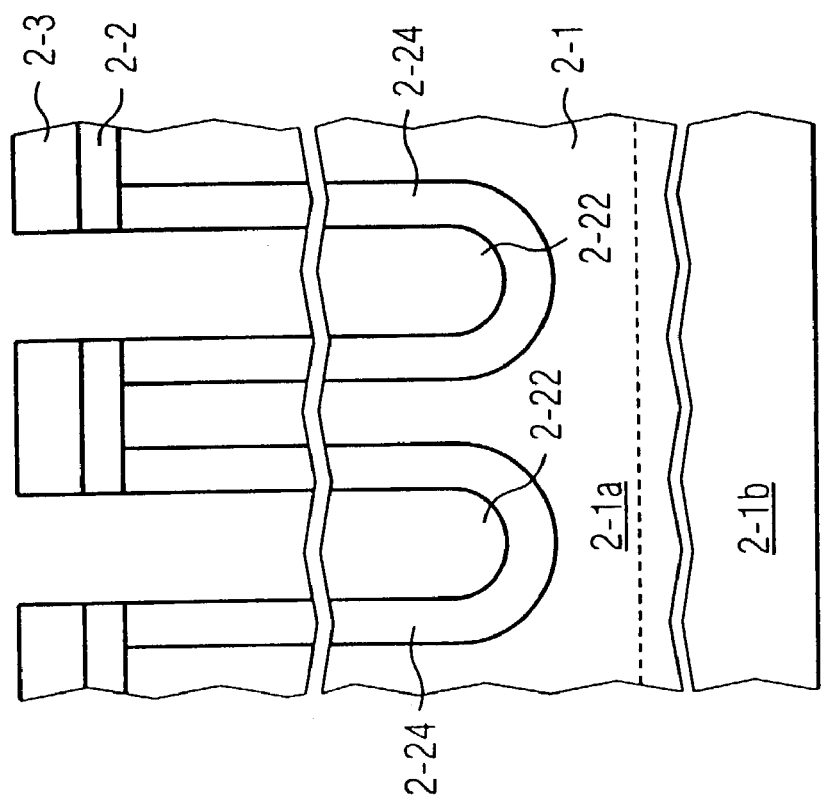

The following steps, i.e. introducing a thin capacitor dielectric layer 2-26 (preferably an ONO layer) into the trenches, introducing a polysilicon layer as a second capacitor plate 2-28 of the storage capacitor onto the capacitor dielectric layer in the trenches, and also patterning these layers using a CMP step, lead to the construction illustrated in FIG. 2F. These steps are prior art and are not described any further here.

Figure 3:
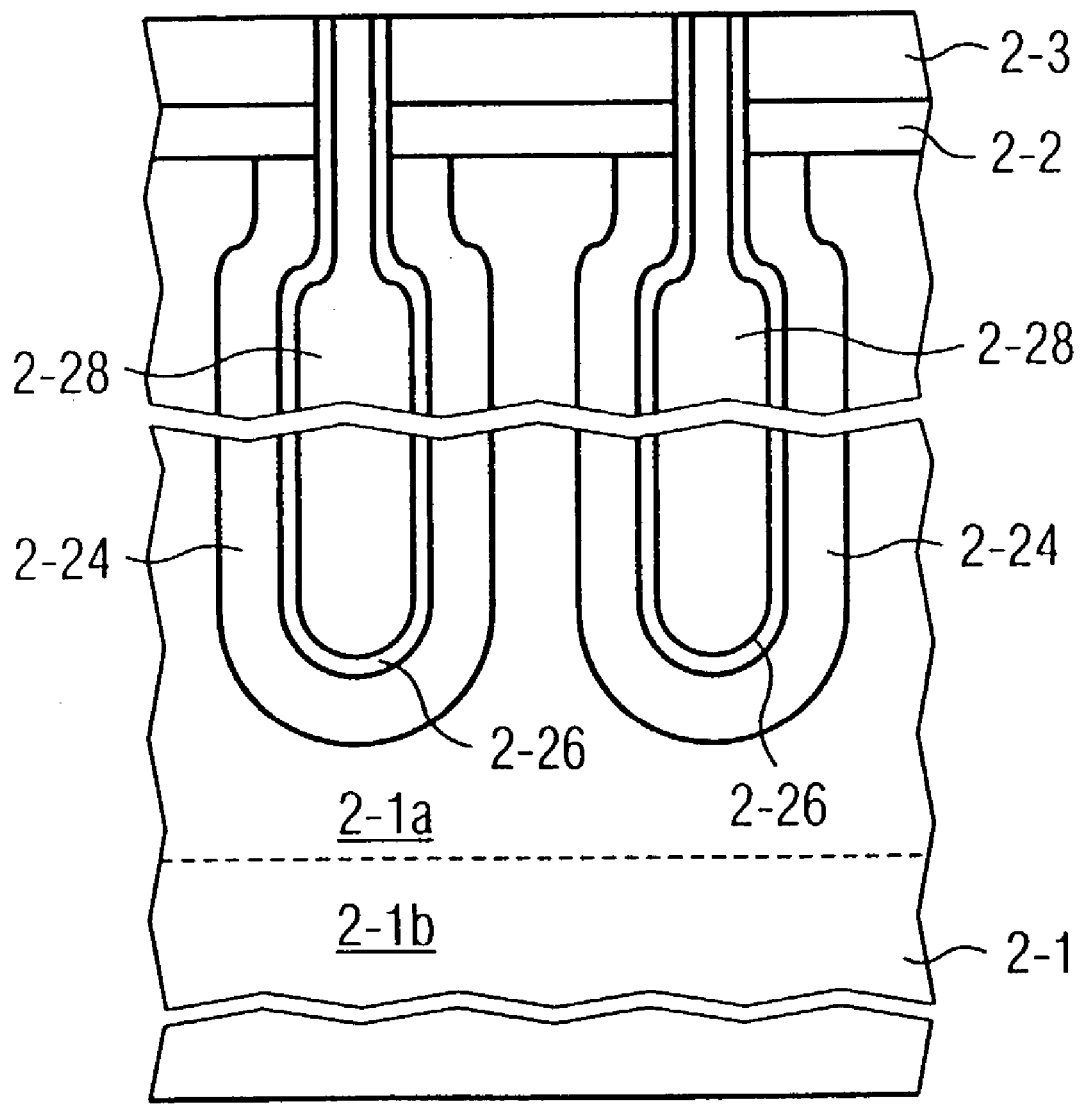
FIG. 3 shows bottle-like trench capacitors that were produced by the inventive method.

FIG. 3 shows a second trench capacitor which has been produced by the inventive method. In contrast to the method illustrated in FIGS. 2A to 2F, however, in this case the current density has been increased from a current density value of 2 $mA/cm^2$ to 10 $mA/cm^2$ during the etching of the trenches at one point in time, so that the lower part of the trench has a larger diameter. The trench acquires a bottle-like form as a result of this change. The further procedure, i.e. the conformal application of the capacitor dielectric 2-26 and the application of the polysilicon layer 2-28 for the second electrode, is analogous to the sequence shown in FIGS. 2A to 2F. The bottle-like form of the trench capacitors offers an increased trench wall area and, consequently, a larger capacitance with the area requirements remaining the same at the surface of the silicon layer.

We claim:

1. A method for producing a plurality of trench capacitors in a p-doped silicon layer for integrated semiconductor memories, the method which comprises:
  providing a p-doped silicon layer having a predetermined resistivity of less than 0.3 ohm cm, a front side, and a rear side;
  producing start nuclei on the front side of the p-doped silicon layer;
  applying an electrolyte to the front side of the p-doped silicon layer, the electrolyte being an organic solution having an added amount of hydrofluoric acid or fluorine;
  applying an electrical voltage between the rear side of the p-doped silicon layer and the electrolyte such that an electric current having a given current density flows in the p-doped silicon layer and the plurality of trenches are produced;
  when performing the step of applying the electrical voltage, setting the electrical voltage such that the current density is 1–10 mA/cm$^2$ at the rear side of the p-doped silicon layer and each of the plurality of trenches being produced will have a diameter of less than 300 nm;
  producing a respective first electrode in each of the plurality of trenches;
  applying a respective capacitor dielectric to the first electrode in each of the plurality of trenches; and
  producing a respective second electrode in each of the plurality of trenches.

2. The method according to claim 1, wherein the p-doped silicon layer is a silicon wafer, part of a p-doped silicon wafer, or bears on a p-doped silicon wafer.

3. The method according to claim 1, which further comprises providing a mask for configuring the start nuclei on the front side of the p-doped silicon layer.

4. The method according to claim 3, wherein the mask is a patterned oxide layer/nitride layer stack, a patterned oxide layer and/or a patterned resist layer.

5. The method according to claim 3, which further comprises performing the step of producing the start nuclei by overetching while fabricating the mask.

6. The method according to claim 3, which further comprises performing the step of producing the start nuclei by alkaline pickling in opened regions of the mask.

7. The method according to claim 1, which further comprises:
  providing the p-doped silicon layer as a silicon wafer having the rear side; and
  before electrically contact connecting the rear side of the silicon wafer, performing a doping step for producing a p$^+$-type doping layer on the rear side of the silicon wafer.

8. The method according to claim 7, which further comprises removing the p$^+$-type doping layer at the rear side of the silicon wafer after the plurality of trenches are produced.

9. The method according to claim 1, which further comprises providing the electrolyte as an organic solution with an added amount of acetonitrile, dimethylformamide or dimethylamide.

10. The method according to claim 1, which further comprises:
  introducing a counterelectrode in the electrolyte; and
  performing the step of applying the electrical voltage by applying an electrical voltage between the counterelectrode and the rear side of the p-doped silicon layer.

11. The method according to claim 10, which further comprises forming and configuring the counterelectrode with regard to the p-doped silicon layer such that when the electrical voltage is applied between the counterelectrode and the rear side of the p-doped silicon layer, the current density of the electrical current is substantially constant at the rear side of the p-doped silicon layer.

12. The method according to claim 10, which further comprises performing the step of applying the electrical voltage between the counterelectrode and the rear side of the p-doped silicon layer by placing the counterelectrode at a negative potential with respect to the rear side of the p-doped silicon layer.

13. The method according to claim 1, which further comprises predetermining the diameter of each of the plurality of trenches by choosing the resistivity of the silicon layer and the current density.

14. The method according to claim 1, which further comprises, when performing the step of applying the electrical voltage, varying the current density with respect to time such that the diameter of each of the plurality of trenches being produced varies along a trench depth.

15. The method according to claim 1, which further comprises, when performing the step of applying the electrical voltage, varying the current density with respect to time such that each of the plurality of trenches being produced has a bottle shape.

16. The method according to claim 1, which further comprises performing the step of applying the electrical voltage such that the diameter of each of the plurality of trenches is less than about 100 nm.

17. The method according to claim 1, which further comprises performing the step of applying the electrical voltage such that a resulting etching rate for producing the plurality of trenches is greater than 1 µm/min.

18. The method according to claim 1, which further comprises performing the step of applying the electrical voltage such that each of the plurality of trenches is produced with a depth of more than 5 µm.

19. The method according to claim 1, which further comprises performing the step of applying the electrical voltage such that each of the plurality of trenches is produced with a depth of more than about 10 µm.

20. The method according to claim 1, wherein each of the plurality of trenches has a depth/diameter aspect ratio of more than 20.

21. The method according to claim 1, wherein each of the plurality of trenches has a depth/diameter aspect ratio of more than 50.

22. The method according to claim 1, which further comprises n-doping trench walls of each of the plurality of trenches by performing a ASG doping and/or a GPD doping.

23. The method according to claim 1, which further comprises using mesopores to enlarge surfaces of inner walls of the plurality of trenches.

24. The method according to claim 1, wherein the semiconductor memories are DRAMs or ferroelectric semiconductor memories.

* * * * *